United States Patent
Wu et al.

(10) Patent No.: US 7,209,385 B1
(45) Date of Patent: Apr. 24, 2007

(54) ARRAY STRUCTURE FOR ASSISTED-CHARGE MEMORY DEVICES

(75) Inventors: Chao-I Wu, Tainan (TW); Ming Hsiu Lee, Hsinchu (TW); Ming-Chang Kuo, Changhua (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 11/327,561

(22) Filed: Jan. 6, 2006

(51) Int. Cl.
 *G11C 16/04* (2006.01)
(52) U.S. Cl. .............................. 365/185.01; 365/185.28
(58) Field of Classification Search ........... 365/185.01, 365/185.28, 185.29
See application file for complete search history.

(56) References Cited

U.S. PATENT DOCUMENTS 5,774,400 A * 6/1998 Lancaster et al. ........ 365/185.3
6,011,725 A * 1/2000 Eitan ...................... 365/185.33
2006/0146603 A1 * 7/2006 Kuo et al. ................. 365/177

* cited by examiner

*Primary Examiner*—Vu A. Le
(74) *Attorney, Agent, or Firm*—Baker & McKenzie LLP

(57) ABSTRACT

An Assisted Charge (AC) Memory cell comprises a transistor that includes, for example, a p-type substrate with an n+ source region and an n+ drain region implanted on the p-type substrate. A gate electrode can be formed over the substrate and portions of the source and drain regions. The gate electrode can comprise a trapping structure. The trapping structure can be treated as electrically split into two sides. One side can be referred to as the "AC-side" and can be fixed at a high voltage by trapping electrons within the structure. The electrons are referred to as assisted charges. The other side of can be used to store data and is referred to as the "data-side." The abrupt electric field between AC-side and the data-side can enhance programming efficiency.

23 Claims, 12 Drawing Sheets

ARRAY STRUCTURE FOR ASSISTED-CHARGE MEMORY DEVICES

BACKGROUND

1. Field of the Invention

The present invention relates generally to semiconductor memory devices and more particularly to semiconductor memory devices that include an assisted charge.

2. Background of the Invention

Traditional EPROM tunnel oxide (ETOX) flash memory cells and the traditional Nitrided Read Only Memory cells suffer from programming inefficiencies since large currents are generally required to perform a programming operation. ETOX flash and Nitrided Read Only Memory cells are programmed using Channel Hot Electron (CHE) injection to program the cells to a high voltage. Hot electrons are electrons that have gained very high kinetic energy after being accelerated by a strong electric field in areas of high field intensities within a semiconductor device, such as ETOX or Nitrided Read Only Memory semiconductor devices. CHE injection occurs when both the gate voltage and the drain voltage are significantly higher than the source voltage, with $Vg \approx Vd$.

Channel carriers that travel from the source to the drain are sometimes driven towards the gate oxide even before they reach the drain because of the high gate voltage. Injected carriers that do not get trapped in the gate oxide become gate current. The injection efficiency of CHE is small, however, and programming using CHE injection requires large programming current and therefore, CHE injection is inefficient with respect to this wasted current.

Another type of memory cell, a PHINES memory cell, uses Band To Band Hot Hole (BTBHH) injection to program cells to a low voltage. Each PHINES memory cells can store 2 bits per cell. One bit can be stored on the source side of the transistor and one bit can be stored on the drain side of the transistor. In these memory cells each bit can have two states; a high current state that can represent a logic "1" and a low current state that can represent a logic "0". Each side of the memory cell can be read by sensing the current through the cell and determining if the current is higher or lower than a threshold.

The BTB current of an erased cell is higher than the BTB current of a programmed cell. For this reason the state of each side of each cell, programmed or not programmed, can be determined by comparing the current through each side of each cell to a threshold, e.g., a gate to drain or gate to source current threshold.

In a PHINES memory device the charge accumulated on the nitride layer can be erased by a process known as Fowler-Nordheim Injection. During an erase cycle, erase voltages are applied to the source, drain, gate and body of the transistor that cause electrons to tunnel through the bottom oxide barrier of the ONO layer into the nitride layer. These electrons can compensate for the holes injected into the nitride layer during programming. The tunneling through the bottom oxide layer can occur in the presence of a high electric field created as a result of application of the erase voltages to the transistor. The tunneling through the bottom oxide layer is a form of quantum mechanical tunneling.

Programming by BTBHH injection can still be too slow, and can require programming times that are too long, for certain applications.

SUMMARY

An Assisted Charge (AC) Memory cell comprises a transistor that includes, for example, a p-type substrate with an n+ source region and an n+ drain region implanted on the p-type substrate. A gate electrode can be formed over the substrate and portions of the source and drain regions. The gate electrode can comprise a trapping structure.

In one aspect, the trapping structure can be treated as electrically split into two sides. One side can be referred to as the "AC-side" and can be fixed at a high voltage by trapping electrons within the structure. The electrons are referred to as assisted charges. The other side can be used to store data and is referred to as the "data-side." The abrupt electric field between AC-side and the data-side can enhance programming efficiency.

These and other features, aspects, and embodiments of the invention are described below in the section entitled "Detailed Description."

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION

Figure 1:
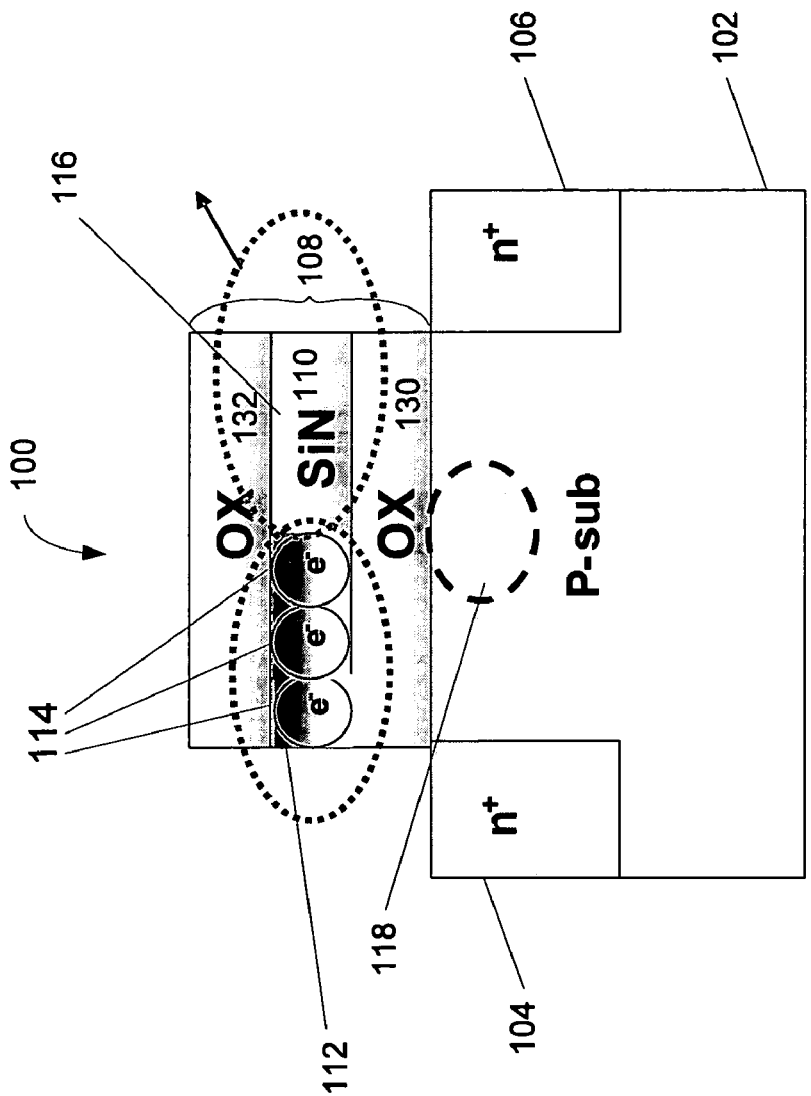
FIG. 1 is a diagram of an Assisted Charge (AC) memory device configured in accordance with one embodiment.

FIG. 1 is a diagram of an Assisted Charge (AC) memory device 100 configured in accordance with one embodiment of the systems and methods described herein. AC-memory device 100 can comprise a transistor that includes a silicon substrate 102. Silicon substrate 102 can serve as a base material that the rest of the memory device 100 can be fabricated on. Two n+ regions 104 and 106 can be created by doping silicon substrate 102. These regions 104 and 106 can act as the source and drain, respectively, for the transistor. An ONO layer 108 can then be deposited on top of silicon substrate 102 between n+ regions 104 and 106. A polysilicon layer (not shown) can be deposited on top of ONO layer 108 to form the gate electrode of the transistor.

ONO layer 108 can include a nitride (N) layer 110 that can trap charge, sandwiched between two silicon oxide layers. For example, electrons that travel upward through the bottom oxide layer can then become trapped within the nitride layer. These electrons can form an assist charge, or be used to store data, as described further below. Nitride layer 110 can be one example of a charge trapping structure.

ONO layer 108 can, for example, be split into two sides. One side can be referred to as AC-side 112. AC-side 112 can be fixed at a high voltage by trapping assisted charges 114 in the nitride layer 110. The other side can be referred to as the data side 116 and can be used to store data. The data can be represented by the voltage level stored in the data side 116 and will be described in more detail below.

An abrupt electrical field region 118 can be created between AC-side 112 and data-side 116. This resulting abrupt electrical field can improve programming efficiency by limiting programming current and/or lowering programming times, depending on the embodiment. For example, the high voltage on the AC-side 112 can limit programming current during Hot Electron (HE) programming, as will be described below with respect to FIG. 2A.

Figures 2A, 2B:
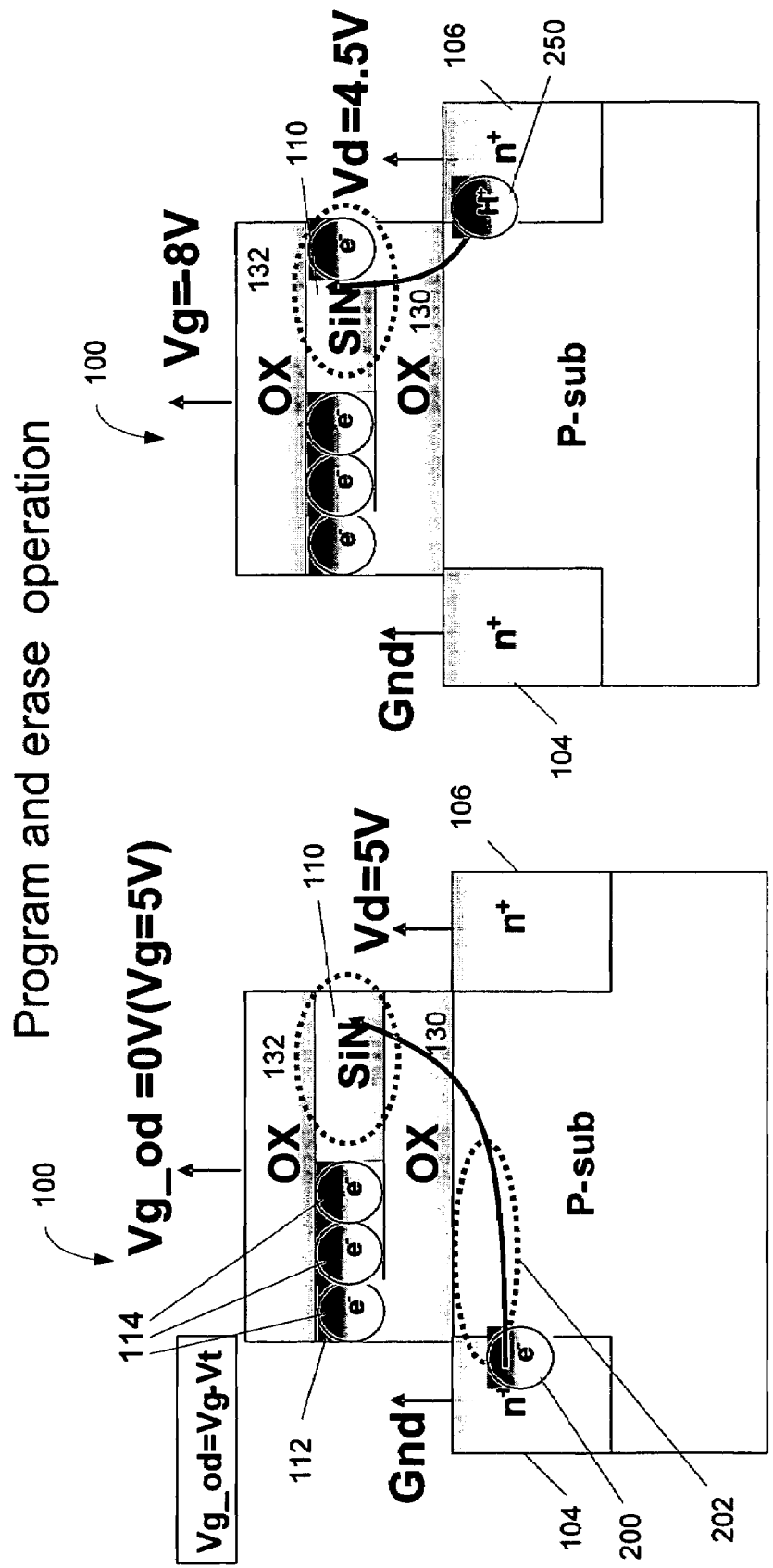
FIG. 2A is a diagram illustrating HE programming of an example AC-memory cell, such as that illustrated in FIG. 1, in accordance with the embodiment.
FIG. 2B is a diagram illustrating an erase operation for an example AC-memory cell, such as that illustrated on FIG. 1, in accordance with one embodiment.

FIG. 2A is a diagram illustrating HE programming of an example AC-memory cell, such as that illustrated in FIG. 1, in accordance with the embodiment of the systems and methods described herein. In a conventional memory cell, a positive voltage on the gate attracts electrons from the p-substrate. These electrons are attracted to the region of the transistor between the source and drain close to the silicon surface. This region is known as the channel. Initially the channel is a non-conducting region; however, when the gate voltage becomes more positively charged, enough electrons are pulled into the channel from the p-substrate to establish a charged path between the source and the drain. Electrons flow across the transistor channel from source to drain and some of these electrons are injected into nitride charge trapping layer 110 through the bottom oxide layer of ONO layer 108. If 0 volts, or low voltage, can be placed on the gate, no electrons, or at least very few, are attracted to the channel and the source and drain are effectively disconnected and little or no current flows across the channel. As a result, few if any electrons are trapped in nitride layer 110.

AC side 112 of AC-memory device 100 is fixed at a high Vt by trapping electrons 114 known as the assisted charge (AC) in layer 110. AC electrons 114 decrease the number of electrons pulled into area 202 of the channel under AC-side 112, since the negative electric charge of these electrons repels electrons in the area 202. This can limit the programming current during HE programming, which reduces the required programming power.

As illustrated in FIG. 2A, when the correct programming voltages are applied, and AC electrons 114 are present, electron 200 can start to flow from source 104 toward drain 106. The flow of electrons can, as described above, be limited by electrons 114 in the AC side 112. In this way the large programming currents that can be required for some conventional devices can be decreased in some implementations. As electron 200 travels from source 104 to drain 106 it will travel through an abrupt electrical field change between AC-side 112 and Data side 116. Some electrons, such as electron 200 will travel through the bottom oxide layer into charge trapping nitride layer 110 on data side 116.

During programming, programming voltages can be applied to gate and drain electrodes, while the source electrode is grounded, or tied to 0 volts. For example, drain 106 and gate 108 can be at 5 volts. It will be understood that different voltages can be used for different implementations.

FIG. 2B is a diagram illustrating an erase operation for an example AC-memory cell, such as that illustrated in FIG. 1, in accordance with one embodiment of the systems and methods described herein. When erasing AC-memory device 100, holes travel from drain 106 to gate and compensate for the electrons trapped in nitride layer 110. Erase voltages can be applied to the gate, drain and source in order to create a voltage difference that will cause holes 250 to flow from drain 106, through oxide layer 130, to nitride layer 110. Holes 250 can compensate for electrons 200 to remove charge from data-side 116. Several of the memory cells can be erased in bulk or by pages or sectors. In this way, the limitations of slower BTBHH can be avoided since many or several cells can be erased at once.

When erasing AC-memory device 100, source 104 can be at ground, drain 106 can be at 4.5 volts, and the gate can be at −8 volts. It will be understood that these are examples of possible voltages that can be used.

Figure 3:
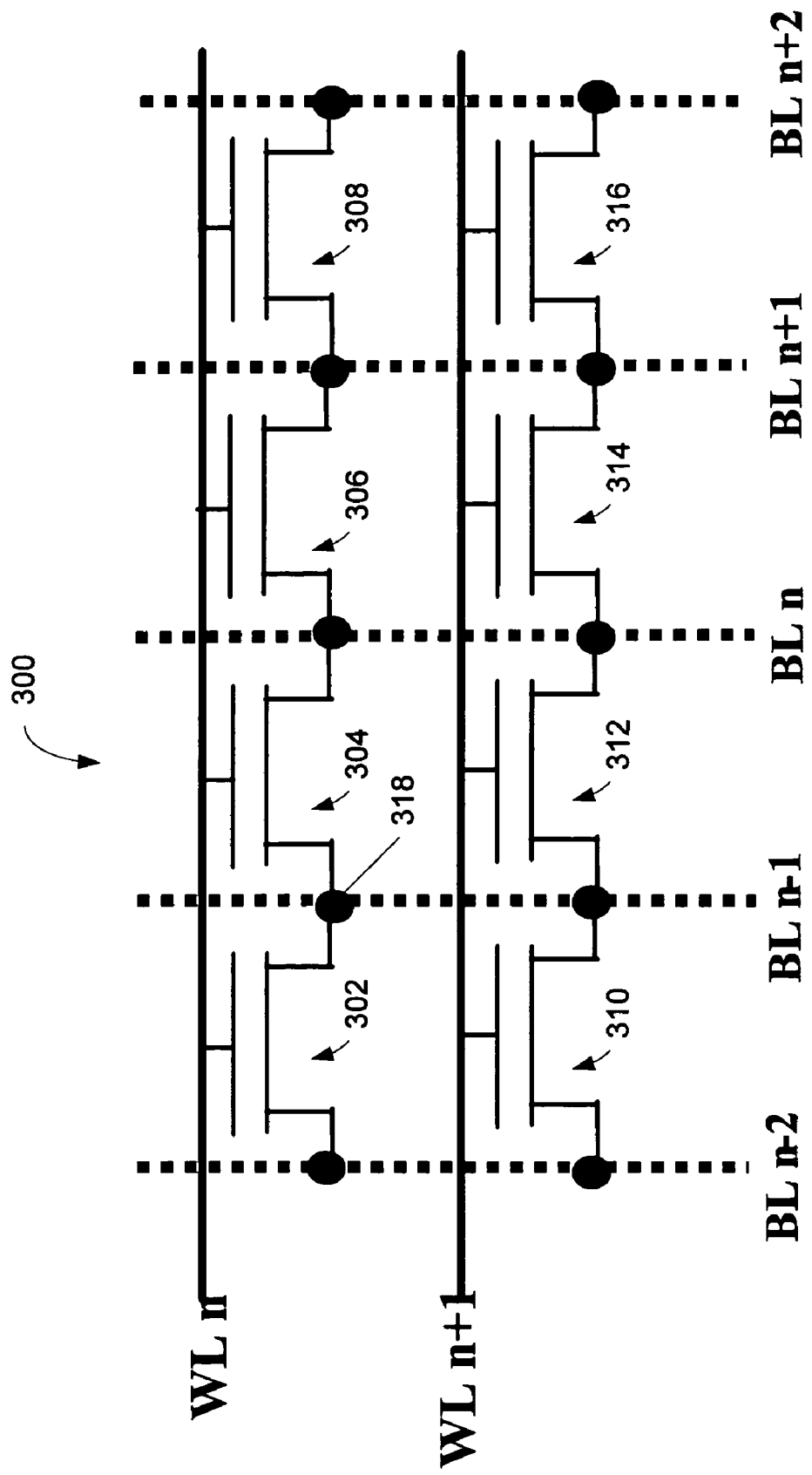
FIG. 3 is a diagram illustrating an example array of AC-memory cells.

FIG. 3 is a diagram illustrating an example array 300 of AC-memory cells 302, 304, 306, 308, 310, 312, 314, and 316. AC-memory cells 302, 304, 306, 308, 310, 312, 314, and 316 can be configured as described in relation to FIGS. 1 and 2. Cells 302, 304, 306, 308, 310, 312, 314, and 316 can be arranged in an array structure, such as the 4×2 array structure of this example. But other array structures comprising more or less cells are also possible.

The gates of each cell 302, 304, 306, and 308 that make up AC-memory cells can be connected to Word Line ($WL_n$), while the gates of each cell 310, 312, 314, and 316 that make up AC-memory cells can be connected to Word Line ($WL_{n+1}$). In this way a voltage can be applied to the gate of several cells in an array at one time. Further, each cell 302, 304, 306, and 308 can be connected such that the source from one cell is connected to the drain of another.

For example, the drain of cell 302 can be connected to the source of cell 304 at connection 318. Connection 318 can also connect to Bit Line ($BL_{n-1}$). $BL_{n-2}$, $BL_n$, $BL_{n+1}$, and $BL_{n+2}$, as shown, have similar connections. In this way voltages can be applied to the gates and drains of each of cells 302, 304, 306, and 308. Cells 310, 312, 314, and 316 can be similarly connected. Using the BL and WL connections voltages can be applied to cells 302, 304, 306, 308, 310, 312, 314, and 316 to program or erase each cell 302, 304, 306, 308, 310, 312, 314, and 316. Programming and erasing cells 302, 304, 306, 308, 310, 312, 314, and 316 will be further discussed below with respect to FIGS. 4–12.

Array 300 can be configured as what is commonly termed a virtual ground array. Further, in one embodiment, the bit lines can be formed as buried diffusion bit lines. It will be apparent, however, that other configurations are also possible.

Figure 4:
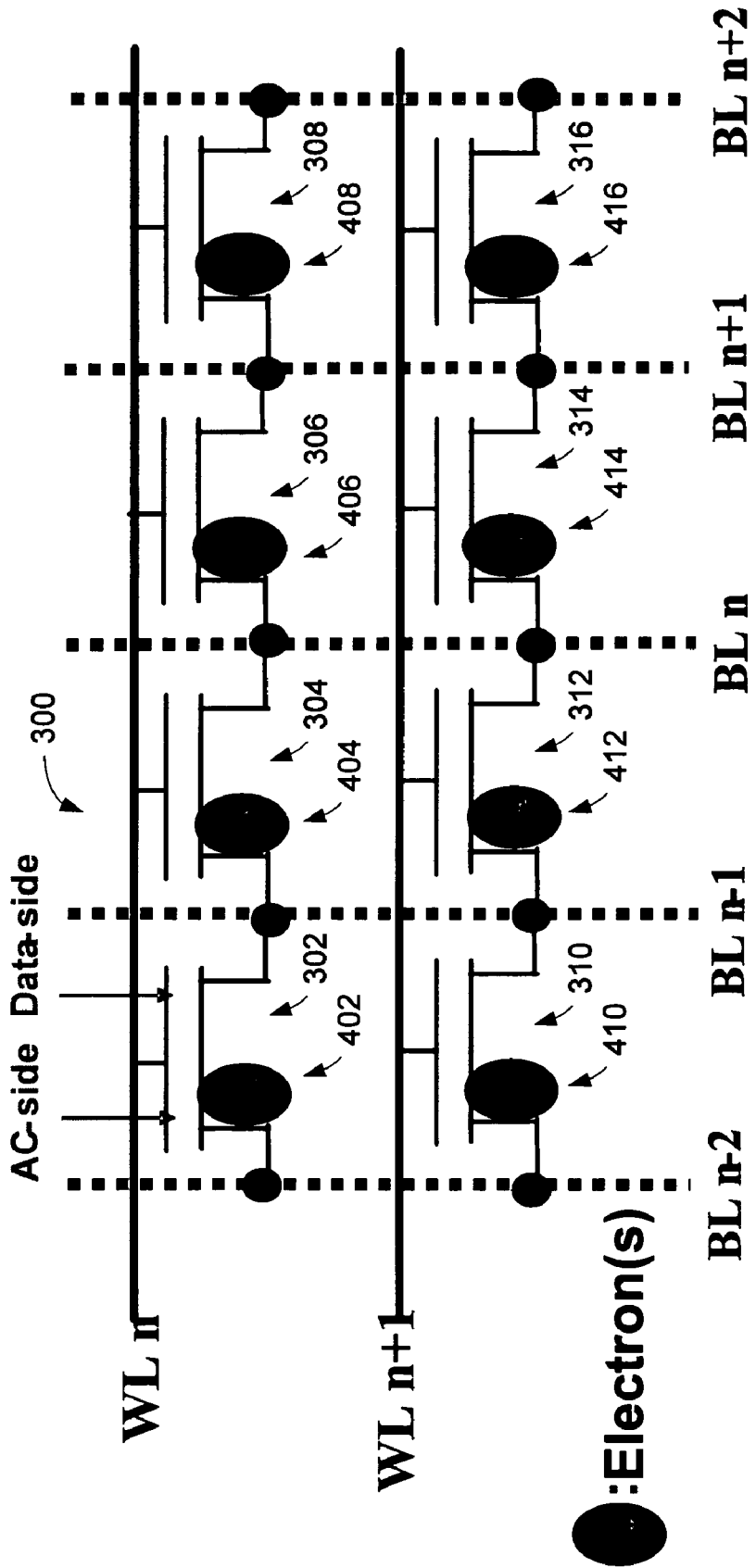
FIG. 4 is a diagram illustrating the array of FIG. 3 after AC charges have been trapped on the AC side of each cell in the array.

FIG. 4 is a diagram illustrating array 300 of AC charges 402, 404, 406, 408, 410, 412, 414, and 416 that have been trapped on the AC side of each cell in the array. Cells 302, 304, 306, 308, 310, 312, 314, and 316 each have an AC-side and a data-side, as described with respect to FIGS. 1, 2A, and 2B. As can be seen, each AC-side includes AC charges, namely, AC charges 402, 404, 406, 408, 410, 412, 414, and 416. Generally many electrons can be used to create a negatively charged region on the AC-side. The number of electrons can vary from implementation to implementation, for example, smaller cells can, in some embodiments require fewer electrons.

Figure 5:
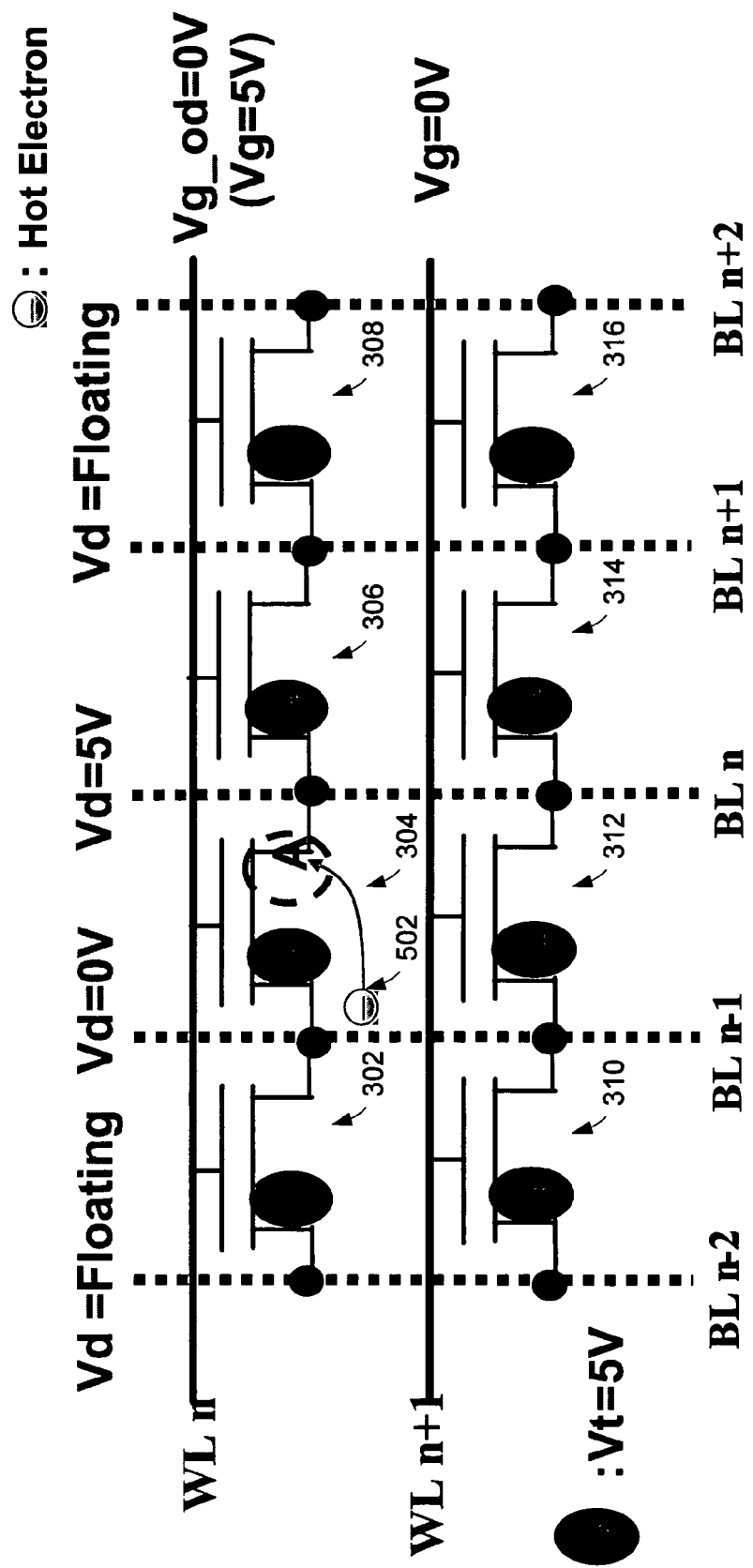
FIG. 5 is a diagram illustrating an example method for programming the array of FIG. 3 in accordance with one embodiment.

FIG. 5 is a diagram illustrating an example method for programming array 300 in accordance with one of the embodiments of the systems and methods described herein. AC-memory cells within array 300 can be programmed individually, as described above with respect to FIG. 2A. By applying programming voltages to the correct WLs and BLs, individual AC-memory cells can be accessed. AC memory cell 304 can, for example, be programmed by applying 0 volts to $BL_{n-1}$, 5 volts to $BL_n$ and 5 volts to $WL_n$. As was described with respect to FIG. 2A, electrons 502 can start to flow from the source toward the drain. Some electrons 502 will travel through the bottom oxide layer into the charge trapping nitride layer on the Data side.

During programming of cell 304 other BLs can be allowed to float and a voltage of 0 volts can be driven on the other WLs. Thus, no current will flow in cells 302, 306, 308, 310, 312, 314, and 316. It will be understood that a transistor described as having "no current" flow can also include cases where much less current flows relative to when the transistor is considered to be "on," or when the transistor is considered to be in a state of relatively high current flow.

Note that in the above example and the examples of FIGS. 6–8, 10–12 each bit line voltage shown in the figures is referenced as Vd, a drain voltage. It will be understood that generally, a drain from one cell can, depending on the particular array structure implemented, be connected to the source of another cell.

Figure 6:
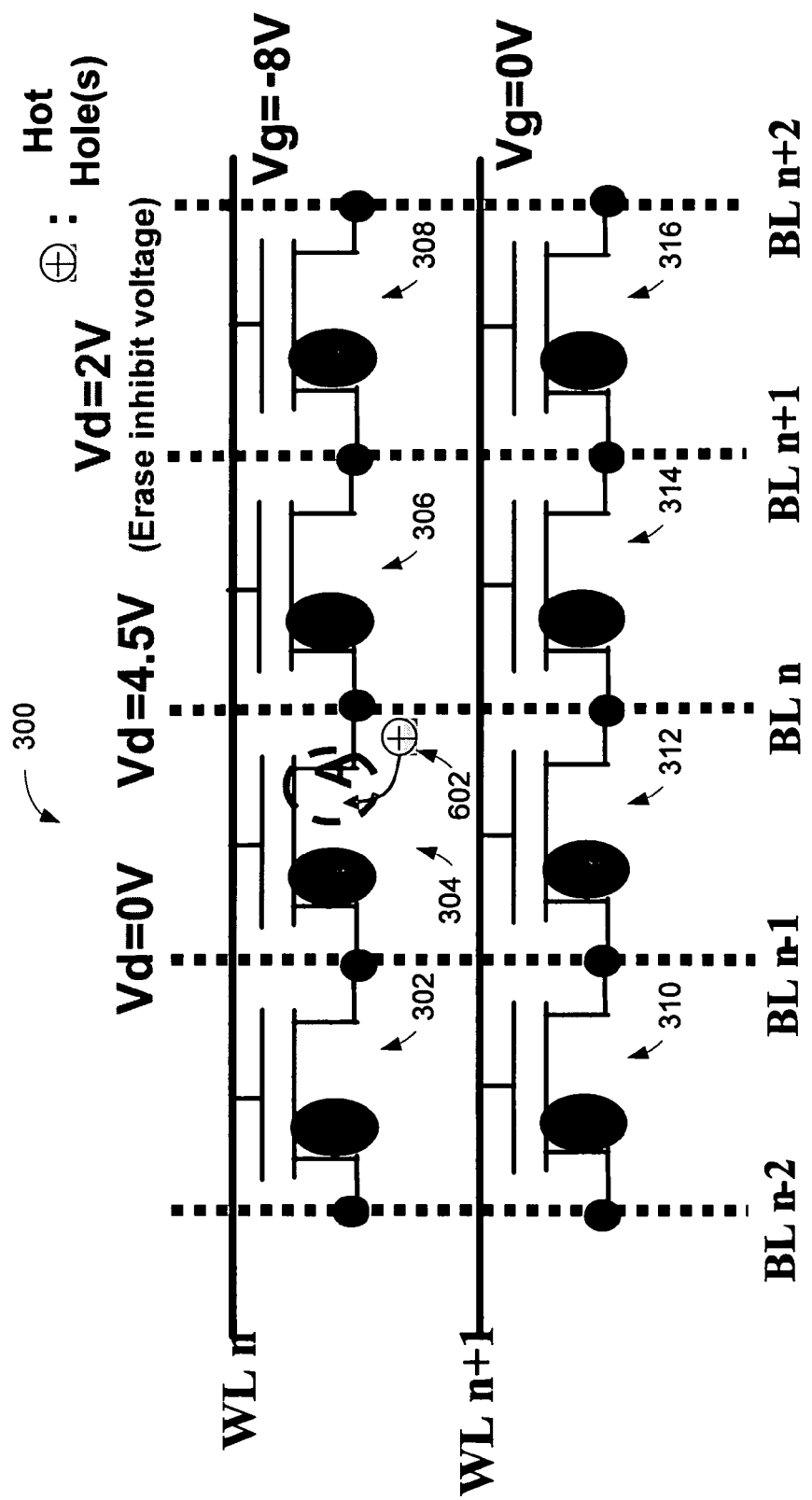
FIG. 6 is a diagram illustrating an example process for a bit by bit erase of the array of FIG. 3 in accordance with one embodiment.

FIG. 6 is a diagram illustrating an example process for a bit by bit erase of array 300 in accordance with one embodiment of the systems and methods described herein. In FIG. 6, array 300 can be configured for a IT EEPROM application. AC-memory cells within array 300 can be erased individually, "bit by bit," by applying various voltages to the correct WLs and BLs. AC memory cell 304 can, for example, be erased by applying 0 volts to $BL_{n-1}$, 4.5 volts to $BL_n$ and −8 volts to $WL_n$. In this way, AC memory cell 304 will have a source voltage of 0 volts, a drain voltage of 5 volts, and a gate voltage −8 volts.

The voltage difference between source and gate is 8 volts and the voltage difference between drain and gate is 12.5V. At the large voltage difference between drain and gate holes 602 can flow from drain to gate. Holes 602 can compensate for electrons stored in the data side of AC-memory cell 304.

Figure 7:
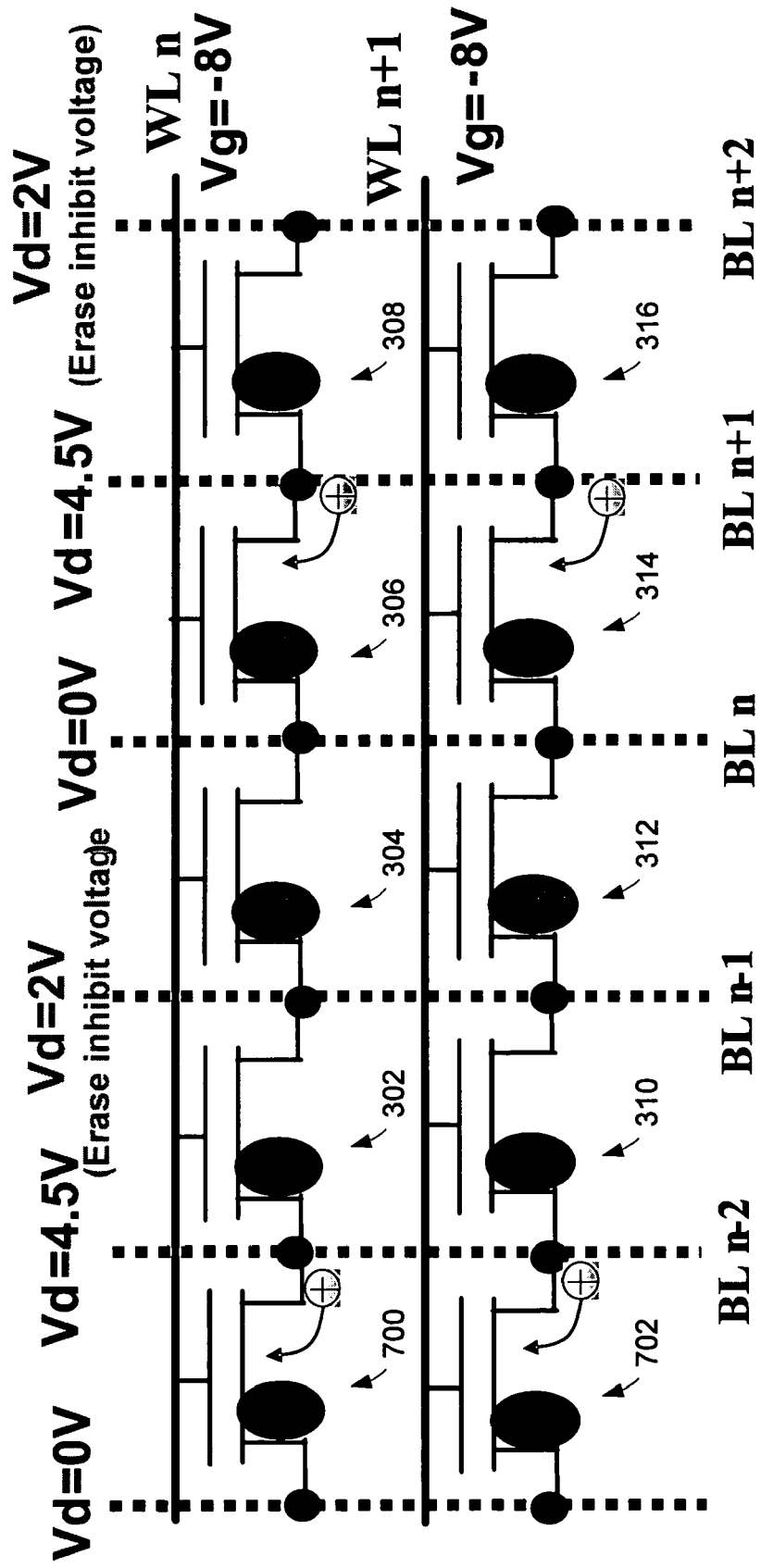
FIG. 7 is a diagram illustrating an example page or sector erase of the array of FIG. 3 in accordance with one embodiment.

FIG. 7 is a diagram illustrating an example process for a page or sector erase of array 300 in accordance with one embodiment of the systems and methods described herein. In FIG. 7, array 300 can be configured for a Flash application. In such an application, AC-memory cells within array 300 can be erased by page or sector, e.g., multiple bits at a time, by applying certain voltages to the correct WLs and BLs.

AC memory cells 306, 314, 700 and 702 can, e.g., be erased during the same operation. For example, by applying 0 or 4.5 volts to the BLs as shown on FIG. 7, and by applying 4 and −8 volts to the appropriate WLs, as shown, each of AC memory cells 306, 314, 700 and 702 that is to be erased will have a source voltage of 0 volts, a drain voltage of 5 volts, and a gate voltage −8 volts. The voltage difference between source and gate for these cells is 8 volts and the voltage difference between drain and gate is 12.5V. At the large voltage difference between drain and gate holes flow from drain to gate, where they will compensate for any electrons stored in the data side of AC-memory cells 306, 314, 700 and 702.

An erase inhibit voltage can be applied to various BLs to prevent the erasure of certain cells, i.e., cells in other sectors or blocks. For example, in the embodiment illustrated in FIG. 7, an erase inhibit voltage of 2 volts can be applied to certain BLs to prevent erasure of cells in other sectors or blocks.

Figure 8:
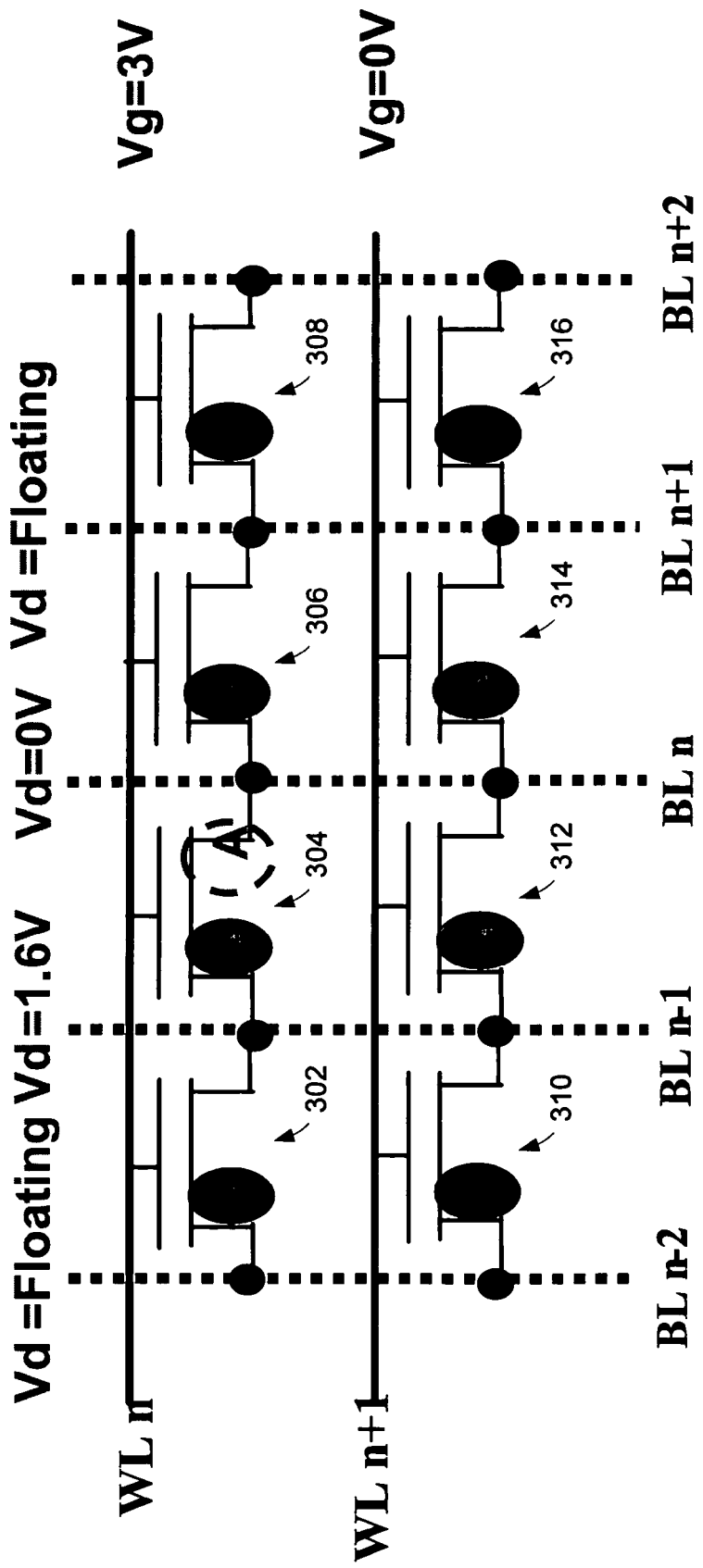
FIG. 8 is a diagram illustrating an example method for reading the array of FIG. 3 in accordance with one embodiment.

FIG. 8 is a diagram illustrating an example method for reading array 300 in accordance with the systems and methods described herein. Individual cells can be read by applying certain voltages to the appropriate WLs and BLs. The source, and/or drain of cells that are not being read can be allowed to float, as shown in FIG. 8.

For example, by applying the correct read voltage to $WL_n$, $BL_{n-1}$, and $BL_n$, AC-memory cell 302 can be read. In one implementation, for example, the gate voltage for cell 302 can be 3 volts, the source voltage can be 1.6 volts, and the drain voltage can be 0 volts. In this way, current can flow when no charge is stored in the data-side of the device, while current will not flow, or at least be lower when charge is stored in the data-side of the device. It will be understood that the actual source, drain and gate voltages needed to read a particular transistor will vary based on the implementation, for example, the amount of charge that is stored in the AC-side of the transistor can effect these voltage requirements.

In one embodiment little or no current can indicate one logic state, while a higher current flow can indicate another logic state. Thus, two states can be stored in each memory cell. Alternatively, in another embodiment, different current levels can indicate multiple logic levels stored in each memory cell.

Figure 9:
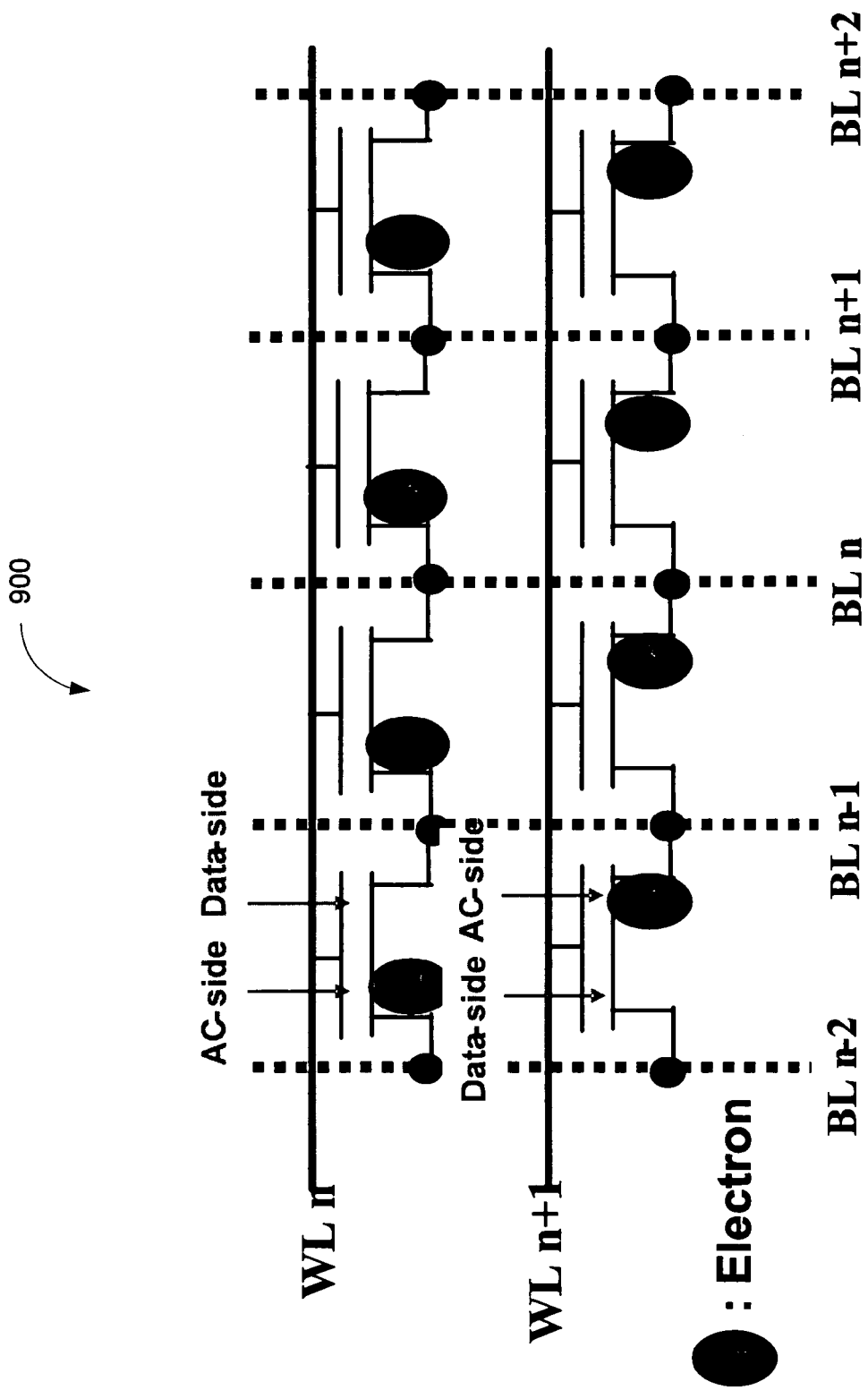
FIG. 9 is a diagram illustrating an example array of AC-memory cells in accordance with another embodiment of the systems and methods described herein.
Figure 10:
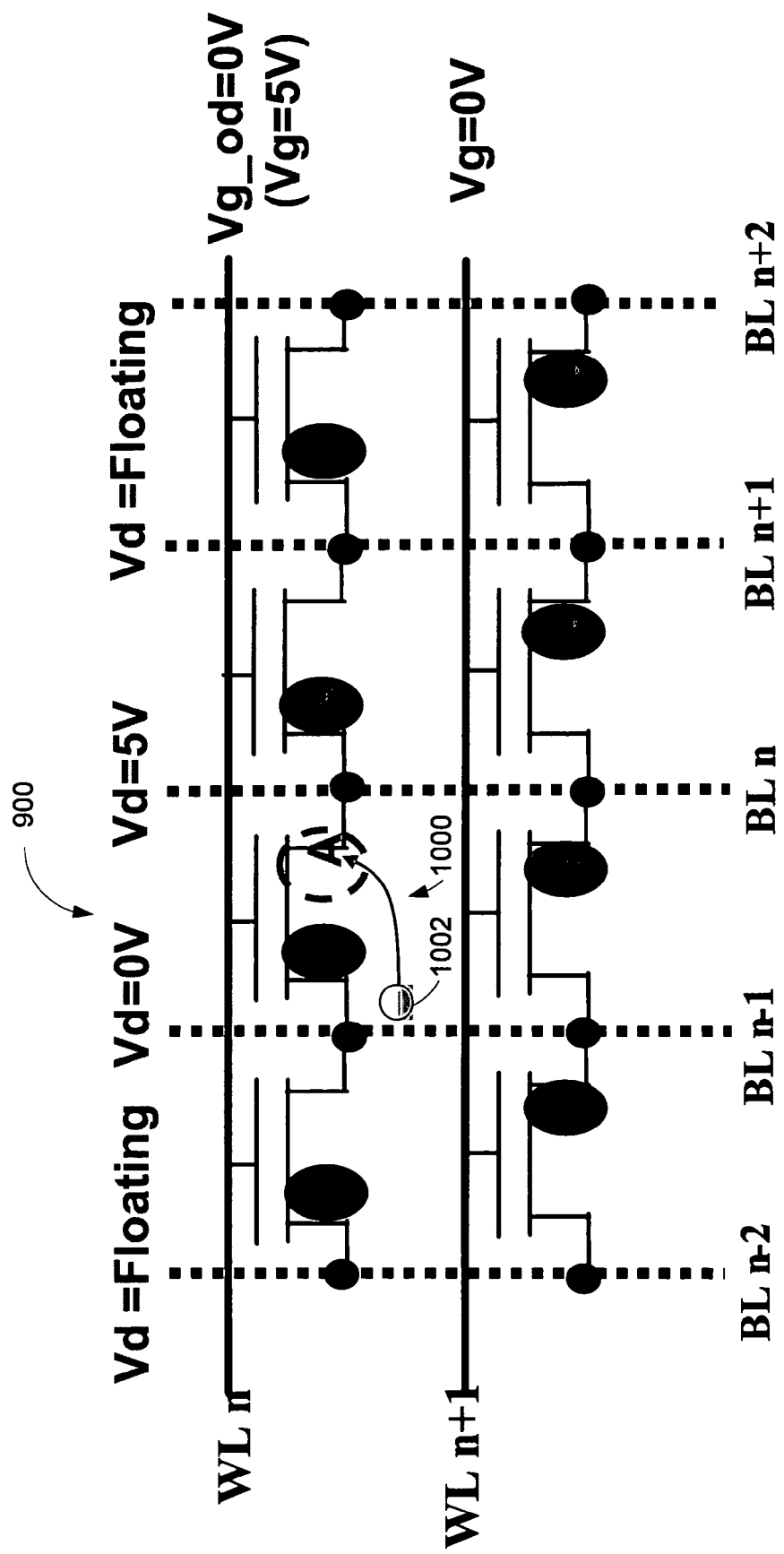
FIG. 10 is a diagram illustrating an example method for programming the array of FIG. 9 in accordance with one embodiment.
Figure 11:
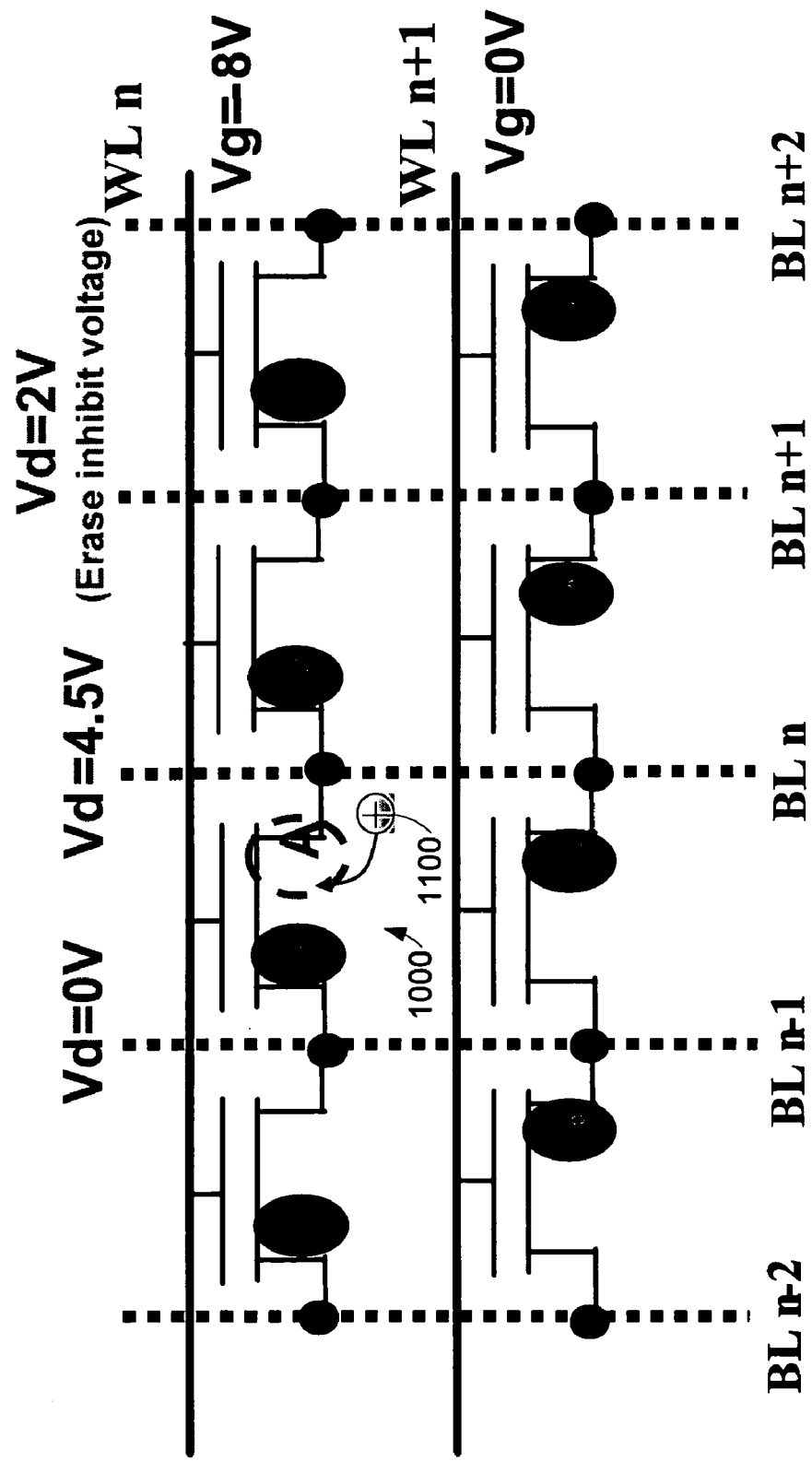
FIG. 11 is a diagram illustrating an example method for performing a bit by bit erase of the array of FIG. 9 in accordance with one embodiment.
Figure 12:
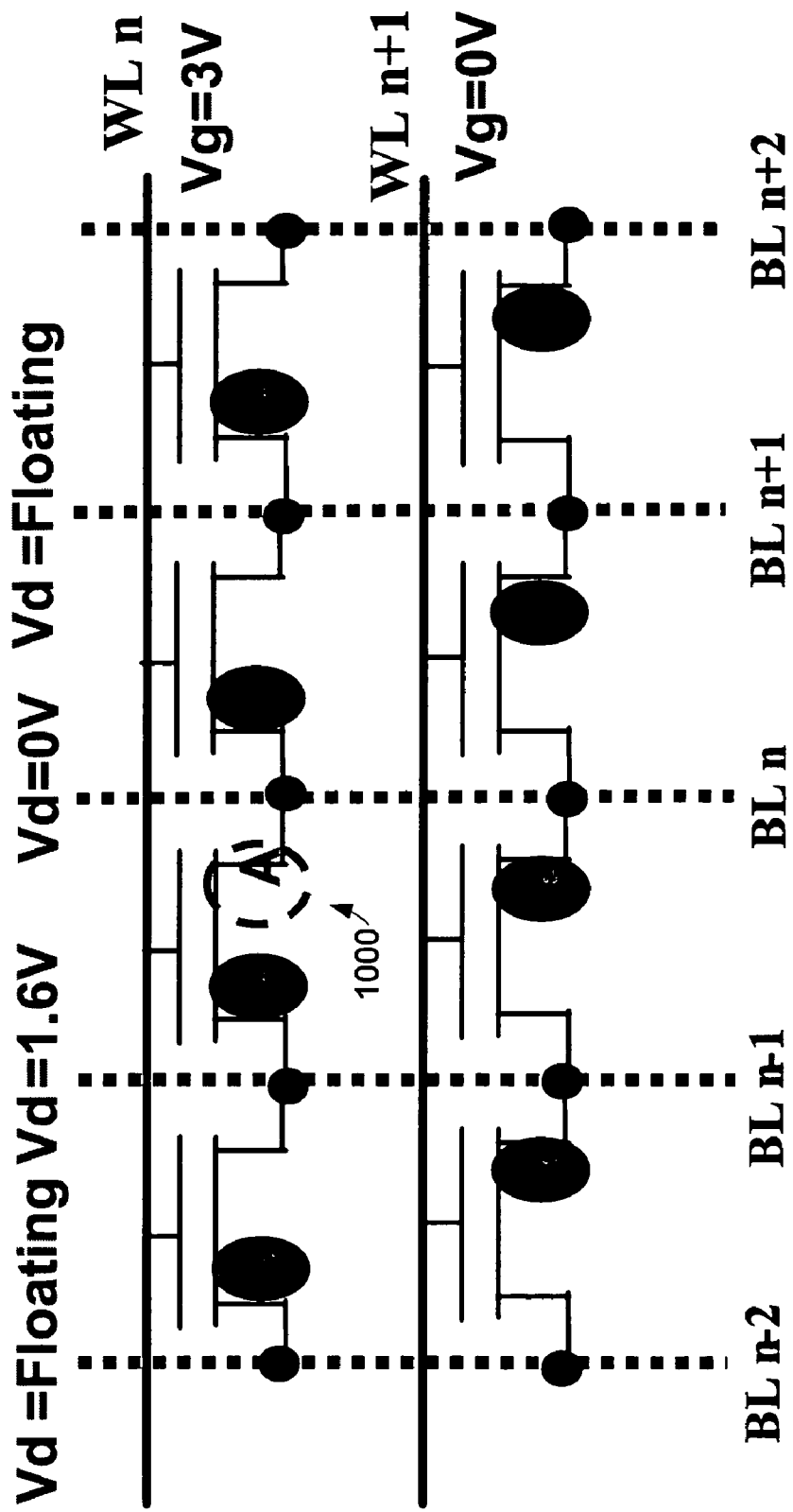
FIG. 12 is a diagram illustrating an example method for reading the array of FIG. 3 in accordance with one embodiment.

FIG. 9 is a diagram illustrating an example array of AC-memory cells 900 in accordance with another embodiment of the systems and methods described herein. Array structure 900 is similar to the array structure 300; however, AC-side and the data-side of AC-memory cells comprising array 900 alternate by row as illustrated. As can be seen in FIGS. 10–12, programming, erasing, and reading can be performed similar to FIGS. 5, 6 and 8.

FIG. 10 is a diagram illustrating an example method for programming array 900 in accordance with one embodiment of the systems and methods described herein. Again, AC-memory cells within array 900 can be programmed individually, by applying certain voltages to the correct WLs and BLs. AC memory cell 1000 can, for example, be programmed by applying 0 volts to $BL_{n-1}$, 5 volts to $BL_n$ and 5 volts to $WL_n$. In this way the transistor of AC memory cell 304 will have a source voltage of 0 volts, a drain voltage of 5 volts, and a gate voltage 5 volts. As was described with respect to FIG. 2A, electrons 1002 can start to flow from source toward drain and some electrons 1002 will travel through the first oxide layer into charge trapping nitride layer on the data side.

During such a programming operation, other BLs can be allowed to float and a voltage of 0 volts can be driven on other WLs. Thus, little or no current will flow in the other cells. In this way, a single AC-memory cell can be programmed, while the other cells remain un-programmed or retain a previously programmed value.

FIG. 11 is a diagram illustrating an example method for performing a bit by bit erase of array 900 in accordance with one embodiment of the systems and methods described herein. AC-memory cells within array 900 can be erased individually, "bit by bit," by applying certain voltages to the correct WLs and BLs. AC memory cell 1000 can, for example, be erased by applying 0 volts to $BL_{n-1}$, 4.5 volts to $BL_n$ and −8 volts to $WL_n$. In this way, AC memory cell 1000 will have a source voltage of 0 volts, a drain voltage of 5 volts, and a gate voltage −8 volts. The voltage difference between source and gate is 8 volts and the voltage difference between drain and gate is 12.5V. The large voltage difference between drain and gate will cause holes flow from drain to gate, where they will compensate for any electrons stored in the data side of AC-memory cell 1000.

FIG. 12 is a diagram illustrating an example method for reading array 900 in accordance with one embodiment of the systems and methods described herein. Again, individual cells can be read by applying certain voltages to the correct WLs and BLs. The source, and/or drain of cells that are not being read can be allowed to float, as shown in FIG. 12.

For example, by applying the correct voltage to $WL_n$, $BL_{n-1}$, and $BL_n$, AC-memory cell 1000 can be read. In one implementation for example, the gate voltage of cell 1000 can be 3 volts, the source voltage can be 1.6 volts, and the drain voltage can be 0 volts. In this way, current can flow when no charge is stored in the data-side of the device, while current will not flow, or at least be lower when charge is stored in the data-side of the device. Again, as discussed with respect to FIG. 8, it will be understood that the actual source, drain and gate voltages needed to read a particular transistor will vary based on implementation, for example, the amount of charge that is stored in the AC-side of the transistor.

Again, depending on the embodiment little or no current can indicate one logic state, while a higher current flow can indicate another logic stated stored in that bit of the memory device. In such an embodiment two states can be stored in each memory cell. Alternatively, in other embodiments, different current levels can indicate multiple logic levels stored in each memory cell.

While certain embodiments of the inventions have been described above, it will be understood that the embodiments described are by way of example only. For example, while p-type substrates and n-type drain and source regions are shown, it will be understood that other embodiments may use n-type substrates with p-type drain and source regions. Further, non-volatile memory devices configured in accordance with the systems and methods described herein can be single well or multiple well devices depending on the embodiment. Accordingly, the inventions should not be limited based on the described embodiments. Rather, the scope of the inventions described herein should only be limited in light of the claims that follow when taken in conjunction with the above description and accompanying drawings.

What is claimed is:

1. A non-volatile memory device, comprising:
   a silicon substrate;
   a drain region formed in the substrate;
   a source region formed in the substrate;
   a trapping structure formed on the substrate, the trapping structure comprising an assisted charge side and a data side;
   an assisted charge trapped within the assisted charge side of the trapping structure; and
   an abrupt electrical field region comprising an abrupt electric field formed by the charge difference between the assisted charge side and the data side of the trapping structure.

2. The non-volatile memory of claim 1; wherein the substrate is a p-type substrate, and the drain and source regions are n-type regions.

3. The non-volatile memory of claim 1, wherein the trapping structure comprises an oxide-nitride-oxide layer.

4. The non-volatile memory of claim 1, wherein the assisted charge is trapped via a hot-electron process.

5. The non-volatile memory of claim 1, wherein charge is stored in the data side via a hot electron process assisted by the abrupt electric field region.

6. The non-volatile memory of claim 1, wherein the data side is erased via band to band hot hole injection.

7. A memory array structure comprising a plurality of assisted charge memory cells, each of the plurality of assisted charge memory cells comprising:
   an assisted charge side and a data side; and
   an abrupt electrical field region, formed by the assisted charge side and the data side of each of the plurality of assisted charge memory cells.

8. The memory array of claim 7, wherein the assisted charge sides of the plurality of assisted charge cells are on the same side.

9. The memory array of claim 7, wherein the assisted charge sides of each of the plurality of assisted charge cells alternates by row of the array.

10. The memory array of claim 7, wherein the array further comprises a plurality of word lines and bit lines coupled with the plurality of non-volatile memory cells.

11. The memory array of claim 10, wherein word lines and bit lines are arranged such that each transistor can be erased individually.

12. The memory array of claim 10, wherein word lines and bit lines are arranged such that each transistor can be programmed individually.

13. The memory array of claim 10, wherein word lines and bit lines are arranged such that each transistor can be erased by page.

14. The memory array of claim 10, wherein word lines and bit lines are arranged such that each transistor can be erased by sector.

15. A method for programming a non-volatile memory cell comprising an assisted charge side and a data side, the method comprising:
   causing an assisted charge to be embedded within the assisted charge side;
   applying a programming voltage to a gate of the non-volatile memory cell;
   applying a programming voltage to a source of the non-volatile memory cell;
   applying a programming voltage to the drain of the non-volatile memory cell; and
   selecting the programming voltages based on the presence of the assisted charge and thereby causing an electron to be trapped in the data-side of the non-volatile memory cell.

16. The method of claim 15, wherein the programming voltage applied to the gate of the non-volatile memory cell is from 3 to 5 volts, the programming voltage applied to the source of the non-volatile memory cell is from 0 to 0.5 volts, and the programming voltage applied to the drain of the non-volatile memory cell is from 4 to 8 volts.

17. The method of claim 15, wherein the programming voltage applied to the gate of the non-volatile memory cell is from 4.5 to 5 volts, the programming voltage applied to the source of the non-volatile memory cell is 0 volts, and the programming voltage applied to the drain of the non-volatile memory cell is from 5 to 5.5 volts.

18. A method for reading a non-volatile memory cell comprising an assisted charge side and a data side, the method comprising:
    causing an assisted charge to be embedded within the assisted charge side;
    applying a read voltage to the gate of the non-volatile memory cell;
    applying a read voltage to the source of the non-volatile memory cell;
    applying a read voltage to the drain of the non-volatile memory cell;
    selecting the read voltages based on the presence of the assisted charge and thereby causing a read current to flow through the memory device; and
    measuring the read current.

19. The method of claim 18, wherein the read voltage applied to the gate of the non-volatile memory cell is from 3 to 5 volts, the read voltage applied to the source of the non-volatile memory cell is from 1 to 2 volts, and the read voltage applied to the drain of the non-volatile memory cell is from 0 to 0.5 volts.

20. The method of claim 18, wherein the read voltage applied to the gate of the non-volatile memory cell is from 3 to 3.5 volts, the read voltage applied to the source of the non-volatile memory cell is from 1.4 to 1.8 volts, and the read voltage applied to the drain of the non-volatile memory cell is 0 volts.

21. A method for erasing a non-volatile memory cell comprising an assisted charge side and a data side, the method comprising:
    causing an assisted charge to be embedded within the assisted charge side;
    applying an erase voltage to the gate of the non-volatile memory cell;
    applying an erase voltage to the source of the non-volatile memory cell;
    applying an erase voltage to the drain of the non-volatile memory cell; and
    selecting these voltages based on the presence of the assisted charge and thereby causing a hole to travel from the transistor drain to the transistor nitride layer such that the hole combines with the electron.

22. The method of claim 21, wherein the erase voltage applied to the gate of the non-volatile memory cell is from approximately −5 to −10 volts, the erase voltage applied to the source of the non-volatile memory cell is from 0 to 0.5 volts and the erase voltage applied to the drain of the non-volatile memory cell is from 4 to 8 volts.

23. The method of claim 21, wherein the erase voltage applied to the gate of the non-volatile memory cell is from approximately −7 to −8 volts, the erase voltage applied to the source of the non-volatile memory cell is 0 volts and the erase voltage applied to the drain of the non-volatile memory cell is 4.5 volts.

* * * * *